(12) United States Patent
Kim

(10) Patent No.: US 12,366,602 B2
(45) Date of Patent: Jul. 22, 2025

(54) SEMICONDUCTOR DEVICE AND METHOD FOR PERFORMING CRACK DETECTION OPERATION

(71) Applicant: SK hynix Inc., Icheon-si (KR)

(72) Inventor: Hyun Seung Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 364 days.

(21) Appl. No.: 18/113,964

(22) Filed: Feb. 24, 2023

(65) Prior Publication Data

US 2024/0183896 A1 Jun. 6, 2024

(30) Foreign Application Priority Data

Dec. 2, 2022 (KR) .......... 10-2022-0167133

(51) Int. Cl.
| | |
|---|---|
| *G01R 31/28* | (2006.01) |
| *G01R 31/10* | (2006.01) |
| *G01R 31/26* | (2020.01) |
| *H01L 21/66* | (2006.01) |
| *H01L 23/00* | (2006.01) |
| *H01L 23/48* | (2006.01) |
| *H01L 23/528* | (2006.01) |

(52) U.S. Cl.
CPC .............. *G01R 31/2836* (2013.01)

(58) Field of Classification Search
CPC ........ G01R 31/10; G01R 31/26; G01R 31/28; H01L 21/66; H01L 23/00; H01L 23/48; H01L 23/528
See application file for complete search history.

(56) References Cited

U.S. PATENT DOCUMENTS

| | | | |
|---|---|---|---|
| 2018/0040361 A1* | 2/2018 | Kwon | ................. G11C 11/4076 |
| 2020/0125522 A1 | 4/2020 | Bartley et al. | |
| 2021/0190854 A1* | 6/2021 | Oh | ..................... G01R 31/2896 |

FOREIGN PATENT DOCUMENTS

KR  1020150072483 A  6/2015

\* cited by examiner

*Primary Examiner* — Neel D Shah
(74) *Attorney, Agent, or Firm* — WILLIAM PARK & ASSOCIATES LTD.

(57) ABSTRACT

A semiconductor device includes a first crack detection circuit configured to receive a first external detection signal and output the first external detection signal as a first internal detection signal through a first metal line or configured to receive the first internal detection signal through the first metal line and output the first internal detection signal as the first external detection signal, and a second crack detection circuit configured to receive the first internal detection signal and output the first internal detection signal as a second internal detection signal through a second metal line or configured to receive the second internal detection signal through the second metal line and output the second internal detection signal as the first internal detection signal.

20 Claims, 22 Drawing Sheets

FIG.4

| FS | BS | THB1 | TLB1 | ICHS1 | ICHS2 |
|---|---|---|---|---|---|
| H | L | L | X | X | H |
| H | L | H | L | X | L |
| L | H | L | X | H | X |
| L | H | H | L | L | X |

SEMICONDUCTOR DEVICE AND METHOD FOR PERFORMING CRACK DETECTION OPERATION

CROSS-REFERENCE TO RELATED APPLICATION

The present application claims priority under 35 U.S.C. § 119(a) to Korean application number 10-2022-0167133, filed in the Korean Intellectual Property Office on Dec. 2, 2022, the entire disclosure of which is incorporated herein by reference.

BACKGROUND

Recently, as the production and supply of mobile devices are increased, the thickness of a semiconductor device which is used as a part of an electronic device also continues to be reduced. In order to fabricate a semiconductor device having a thin thickness, a method of grating the back of a wafer and reducing the thickness of an individual die is also used. In this case, if the die having a reduced thickness is diced, an unwanted crack may occur around the boundary line of the diced die. The crack may hinder a normal operation of the semiconductor device because the crack may cause damage to circuits or electrodes that are disposed in the circumference of the die. Such a crack may be detected based on characteristic or physical analysis of the semiconductor device.

SUMMARY

In an embodiment, a semiconductor device may include a first crack detection circuit configured to receive a first external detection signal and output the first external detection signal as a first internal detection signal through a first metal line or configured to receive the first internal detection signal through the first metal line and output the first internal detection signal as the first external detection signal, and a second crack detection circuit configured to receive the first internal detection signal and output the first internal detection signal as a second internal detection signal through a second metal line or configured to receive the second internal detection signal through the second metal line and output the second internal detection signal as the first internal detection signal. In the present disclosure, it may be preferred that the second crack detection circuit is configured to set the logic level of one of the first internal detection signal and the second internal detection signal based on one of a first high setting signal and a first low setting signal.

Furthermore, in an embodiment, a method of performing a crack detection operation may include setting, as a preset logic level, a logic level of a first internal detection signal that is transmitted through a first metal line when a forward signal has been activated, outputting the first internal detection signal as a second internal detection signal that is transmitted through a second metal line, and outputting the second internal detection signal as a first external detection signal, and setting a logic level of the second internal detection signal as the preset logic level when the forward signal has been activated and outputting the second internal detection signal as the first external detection signal.

BRIEF DESCRIPTION OF THE DRAWINGS

FIG. 4 is a table for describing an operation of the second crack detection circuit according to an example of the present disclosure.

DETAILED DESCRIPTION

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

A "logic bit set" may mean a combination of logic levels of bits included in a signal. When a logic level of each of the bits included in the signal is changed, a logic bit set of the signal may be differently set. For example, if two bits are included in a signal, a logic bit set of the signal may be set as a first logic bit set when logic levels of the two bits included in the signal are a "logic low level" and a "logic low level" and may be set as a second logic bit set when logic levels of the two bits included in the signal are a "logic low level", and a "logic high level."

Hereafter, the present disclosure will be described in more detail through embodiments. The embodiments are only used to exemplify the present disclosure, and the scope of the present disclosure is not limited by the embodiments.

Figure 1:
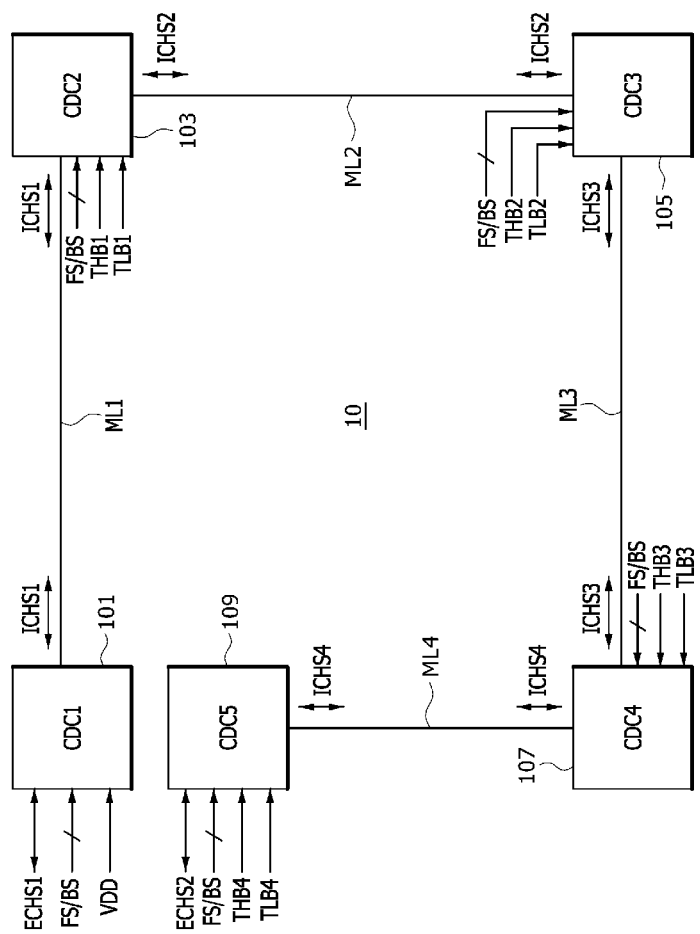
FIG. 1 is a block diagram illustrating a construction of a semiconductor device according to an example of the present disclosure.

FIG. 1 is a block diagram illustrating a construction of a semiconductor device 10 according to an example of the present disclosure. As illustrated in FIG. 1, the semiconductor device 10 may include a first crack detection circuit (CDC1) 101, a second crack detection circuit (CDC2) 103, a third crack detection circuit (CDC3) 105, a fourth crack detection circuit (CDC4) 107, a fifth crack detection circuit (CDC5) 109, a first metal line ML1, a second metal line ML2, a third metal line ML3, and a fourth metal line ML4.

The first crack detection circuit 101 may be connected to the first metal line ML1. The first crack detection circuit 101 may receive a forward signal FS, a backward signal BS, and a source voltage VDD from an external device (not illustrated). The external device (not illustrated) may be a controller (1002 in FIG. 21 or 2300 in FIG. 22), a test device (not illustrated), or the like. The first crack detection circuit 101 may output a first external detection signal ECHS1 as a first internal detection signal ICHS1 based on the forward signal FS or may output the first internal detection signal ICHS1 as the first external detection signal ECHS1 based on the backward signal BS. Through the first metal line ML1, the first crack detection circuit 101 may output, as the first internal detection signal ICHS1, the first external detection signal ECHS1 that has been received through the external device (not illustrated) when the forward signal FS is activated. The first crack detection circuit 101 may output, as the first external detection signal ECHS1, the first internal detection signal ICHS1 that has been received through the first metal line ML1 when the backward signal BS is activated. The first crack detection circuit 101 may apply, to the external device (not illustrated), the first external detection signal ECHS1 that is output when the backward signal BS is activated. When a crack occurs in the first metal line ML1, the first crack detection circuit 101 cannot perform an operation of outputting the first external detection signal ECHS1 as the first internal detection signal ICHS1 or outputting the first internal detection signal ICHS1 as the first external detection signal ECHS1 properly based on the forward signal FS and the backward signal BS. The levels of the forward signal FS and the backward signal BS may be activated to a logic high level, but this is merely an embodiment and the present disclosure is not limited thereto. The first crack detection circuit 101 may be disposed in an upper left area of the semiconductor device 10, but this is merely an embodiment and the present disclosure is not limited thereto.

The second crack detection circuit 103 may be connected to the first metal line ML1 and the second metal line ML2. The second crack detection circuit 103 may receive the forward signal FS, the backward signal BS, a first high setting signal THB1, and a first low setting signal TLB1. Based on the forward signal FS, the backward signal BS, the first high setting signal THB1, and the first low setting signal TLB1, the second crack detection circuit 103 may transfer the first internal detection signal ICHS1 as a second internal detection signal ICHS2 or may transfer the second internal detection signal ICHS2 as the first internal detection signal ICHS1. Through the second metal line ML2, the second crack detection circuit 103 may output, as the second internal detection signal ICHS2, the first internal detection signal ICHS1 that has been received through the first metal line ML1 when the forward signal FS is activated when the first high setting signal THB1 and the first low setting signal TLB1 have been inactivated. When the first high setting signal THB1 and the forward signal FS are activated, the second crack detection circuit 103 may set the second internal detection signal ICHS2 that is output through the second metal line ML2 at a logic high level. When the first low setting signal TLB1 and the forward signal FS are activated, the second crack detection circuit 103 may set the second internal detection signal ICHS2 that is output through the second metal line ML2 at a logic low level. Through the first metal line ML1, the second crack detection circuit 103 may output, as the first internal detection signal ICHS1, the second internal detection signal ICHS2 that has been received through the second metal line ML2 when the backward signal BS is activated based on the first high setting signal THB1 and the first low setting signal TLB1 having been inactivated. When the first high setting signal THB1 and the backward signal BS are activated, the second crack detection circuit 103 may set the first internal detection signal ICHS1 that is output through the first metal line ML1 at a logic high level. When the first low setting signal TLB1 and the backward signal BS are activated, the second crack detection circuit 103 may set the first internal detection signal ICHS1 that is output through the first metal line ML1 at a logic low level. When a crack occurs in at least one of the first metal line ML1 and the second metal line ML2, the second crack detection circuit 103 cannot perform an operation of outputting the first internal detection signal ICHS1 as the second internal detection signal ICHS2 or outputting the second internal detection signal ICHS2 as the first internal detection signal ICHS1 properly based on the forward signal FS and the backward signal BS. Furthermore, when a crack occurs in at least one of the first metal line ML1 and the second metal line ML2, the second crack detection circuit 103 cannot set the logic levels of the first internal detection signal ICHS1 and the second internal detection signal ICHS2 properly based on the first high setting signal THB1 and the first low setting signal TLB1. The levels of the first high setting signal THB1 and the first low setting signal TLB1 may be activated to a logic low level, but this is merely an embodiment and the present disclosure is not limited thereto. The second crack detection circuit 103 may be disposed in an upper right area of the semiconductor device 10, but this is merely an embodiment and the present disclosure is not limited thereto.

The third crack detection circuit 105 may be connected to the second metal line ML2 and the third metal line ML3. The third crack detection circuit 105 may receive the forward signal FS, the backward signal BS, a second high setting signal THB2, and a second low setting signal TLB2. Based on the forward signal FS, the backward signal BS, the second high setting signal THB2 and the second low setting signal TLB2, the third crack detection circuit 105 may transfer the second internal detection signal ICHS2 as a third internal detection signal ICHS3 or may transfer the third internal detection signal ICHS3 as the second internal detection signal ICHS2. Through the third metal line ML3, the third crack detection circuit 105 may output, as the third internal detection signal ICHS3, the second internal detection signal ICHS2 that has been received through the second metal line ML2 when the forward signal FS is activated based on the second high setting signal THB2 and the second low setting signal TLB2 having been inactivated.

When the second high setting signal THB2 and the forward signal FS are activated, the third crack detection circuit 105 may set the third internal detection signal ICHS3 that is output through the third metal line ML3 at a logic high level. When the second low setting signal TLB2 and the forward signal FS are activated, the third crack detection circuit 105 may set the third internal detection signal ICHS3 that is output through the third metal line ML3 at a logic low level. Through the second metal line ML2, the third crack detection circuit 105 may output, as the second internal detection signal ICHS2, the third internal detection signal ICHS3 that has been received through the third metal line ML3 when the backward signal BS is activated based on the second high setting signal THB2 and the second low setting signal TLB2 having been inactivated. When the second high setting signal THB2 and the backward signal BS are activated, the third crack detection circuit 105 may set the second internal detection signal ICHS2 that is output through the second metal line ML2 at a logic high level. When the second low setting signal TLB2 and the backward signal BS are activated, the third crack detection circuit 105 may set the second internal detection signal ICHS2 that is output through the second metal line ML2 at a logic low level. When a crack occurs in at least one of the second metal line ML2 and the third metal line ML3, the third crack detection circuit 105 cannot perform an operation of outputting the second internal detection signal ICHS2 as the third internal detection signal ICHS3 or outputting the third internal detection signal ICHS3 as the second internal detection signal ICHS2 properly based on the forward signal FS and the backward signal BS. Furthermore, when a crack occurs in at least one of the second metal line ML2 and the third metal line ML3, the third crack detection circuit 105 cannot set the logic levels of the second internal detection signal ICHS2 and the third internal detection signal ICHS3 properly based on the second high setting signal THB2 and the second low setting signal TLB2. The levels of the second high setting signal THB2 and the second low setting signal TLB2 may be activated to a logic low level, but this is merely an embodiment and the present disclosure is not limited thereto. The third crack detection circuit 105 may be disposed in a lower right area of the semiconductor device 10, but this is merely an embodiment and the present disclosure is not limited thereto.

The fourth crack detection circuit 107 may be connected to the third metal line ML3 and the fourth metal line ML4. The fourth crack detection circuit 107 may receive the forward signal FS, the backward signal BS, a third high setting signal THB3, and a third low setting signal TLB3. The fourth crack detection circuit 107 may transfer the third internal detection signal ICHS3 as a fourth internal detection signal ICHS4 or may transfer the fourth internal detection signal ICHS4 as the third internal detection signal ICHS3 based on the forward signal FS, the backward signal BS, the third high setting signal THB3, and the third low setting signal TLB3. Through the fourth metal line ML4, the fourth crack detection circuit 107 may output, as the fourth internal detection signal ICHS4, the third internal detection signal ICHS3 that has been received through the third metal line ML3 when the forward signal FS is activated based on the third high setting signal THB3 and the third low setting signal TLB3 having been inactivated. When the third high setting signal THB3 and the forward signal FS are activated, the fourth crack detection circuit 107 may set the fourth internal detection signal ICHS4 that is output through the fourth metal line ML4 at a logic high level. When the third low setting signal TLB3 and the forward signal FS are activated, the fourth crack detection circuit 107 may set the fourth internal detection signal ICHS4 that is output through the fourth metal line ML4 at a logic low level. Through the third metal line ML3, the fourth crack detection circuit 107 may output, as the third internal detection signal ICHS3, the fourth internal detection signal ICHS4 that has been received through the fourth metal line ML4 when the backward signal BS is activated based on the third high setting signal THB3 and the third low setting signal TLB3 having been inactivated. When the third high setting signal THB3 and the backward signal BS are activated, the fourth crack detection circuit 107 may set the third internal detection signal ICHS3 that is output through the third metal line ML3. When the third low setting signal TLB3 and the backward signal BS are activated, the fourth crack detection circuit 107 may set the third internal detection signal ICHS3 that is output through the third metal line ML3 at a logic low level. When a crack occurs in at least one of the third metal line ML3 and the fourth metal line ML4, the fourth crack detection circuit 107 cannot perform an operation of outputting the third internal detection signal ICHS3 as the fourth internal detection signal ICHS4 or outputting the fourth internal detection signal ICHS4 as the third internal detection signal ICHS3 properly based on the forward signal FS and the backward signal BS. Furthermore, when a crack occurs in at least one of the third metal line ML3 and the fourth metal line ML4, the fourth crack detection circuit 107 cannot set the logic levels of the third internal detection signal ICHS3 and the fourth internal detection signal ICHS4 properly based on the third high setting signal THB3 and the third low setting signal TLB3. The levels of the third high setting signal THB3 and the third low setting signal TLB3 may be activated to a logic low level, but this is merely an embodiment and the present disclosure is not limited thereto. The fourth crack detection circuit 107 may be disposed in a lower left area of the semiconductor device 10, but this is merely an embodiment and the present disclosure is not limited thereto.

The fifth crack detection circuit 109 may be connected to the fourth metal line ML4. The fifth crack detection circuit 109 may receive the forward signal FS, the backward signal BS, a fourth high setting signal THB4, and a fourth low setting signal TLB4. Based on the forward signal FS, the backward signal BS, the fourth high setting signal THB4, and the fourth low setting signal TLB4, the fifth crack detection circuit 109 may transfer the fourth internal detection signal ICHS4 as a second external detection signal ECHS2 or transfer the second external detection signal ECHS2 as the fourth internal detection signal ICHS4. The fifth crack detection circuit 109 may output the fourth internal detection signal ICHS4 that has been received through the fourth metal line ML4 as the second external detection signal ECHS2 when the forward signal FS is activated based on the fourth high setting signal THB4 and the fourth low setting signal TLB4 having been inactivated and may apply the second external detection signal ECHS2 to the external device (not illustrated). When the fourth high setting signal THB4 and the forward signal FS are activated, the fifth crack detection circuit 109 may set the second external detection signal ECHS2 that is applied to the external device (not illustrated) at a logic high level. When the fourth low setting signal TLB4 and the forward signal FS are activated, the fifth crack detection circuit 109 may set the second external detection signal ECHS2 that is applied to the external device (not illustrated) at a logic low level. Through the fourth metal line ML4, the fifth crack detection circuit 109 may output, as the fourth internal detection signal ICHS4, the second external detection signal ECHS2 that has been received from the external device (not illustrated) when the backward signal BS is activated based on the fourth high setting signal THB4 and the fourth low setting signal TLB4 having been inactivated. When the fourth high setting signal THB4 and the backward signal BS are activated, the fifth crack detection circuit 109 may set the fourth internal detection signal ICHS4 that is output through the fourth metal line ML4 at a logic high level. When the fourth low setting signal TLB4 and the backward signal BS are activated, the fifth crack detection circuit 109 may set the fourth internal detection signal ICHS4 that is output through the fourth metal line ML4 at a logic low level. When a crack occurs in the fourth metal line ML4, the fifth crack detection circuit 109 cannot perform an operation of outputting the fourth internal detection signal ICHS4 as the second external detection signal ECHS2 or outputting the second external detection signal ECHS2 as the fourth internal detection signal ICHS4 properly based on the forward signal FS and the backward signal BS. Furthermore, when a crack occurs in the fourth metal line ML4, the fifth crack detection circuit 109 cannot set the logic levels of the third internal detection signal ICHS3 and the fourth internal detection signal ICHS4 properly based on the fourth high setting signal THB4 and the fourth low setting signal TLB4. The levels of the fourth high setting signal THB4 and the fourth low setting signal TLB4 may be activated to a logic low level, but this is merely an embodiment and the present disclosure is not limited thereto. The fifth crack detection circuit 109 may be disposed in a lower area of the first crack detection circuit 101, but this is merely an embodiment and the present disclosure is not limited thereto.

Figure 2:
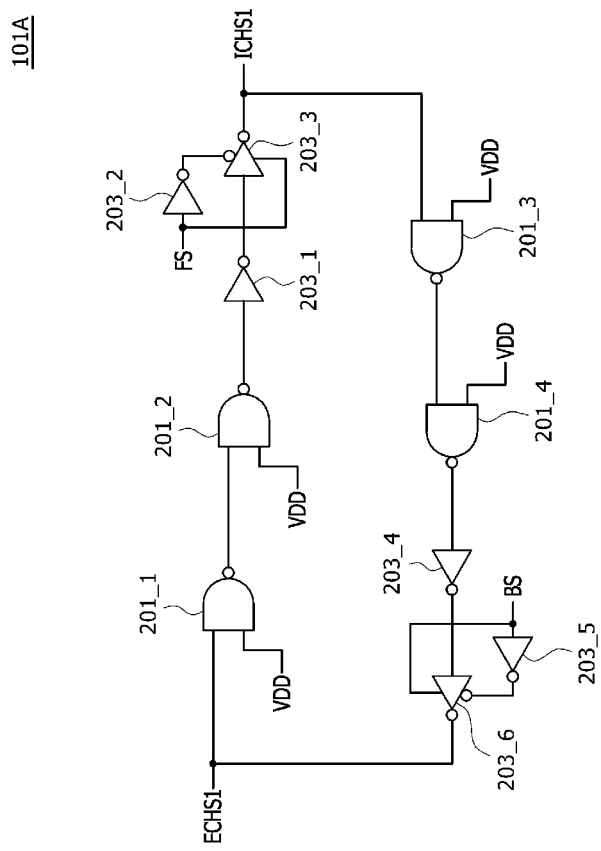
FIG. 2 is a circuit diagram of a first crack detection circuit according to an example of the present disclosure.

FIG. 2 is a circuit diagram of a first crack detection circuit 101A according to an example of the first crack detection circuit 101. As illustrated in FIG. 2, the first crack detection circuit 101A may include NAND gates 201_1 to 201_4 and inverters 203_1 to 203_6. The NAND gate 201_1 may perform a NAND operation by receiving the first external detection signal ECHS1 and the source voltage VDD. The NAND gate 201_1 may output the first external detection signal ECHS1 by inverting and buffering the first external detection signal ECHS1. The NAND gate 201_2 may perform a NAND operation by receiving the output signal of the NAND gate 201_1 and the source voltage VDD. The NAND gate 201_2 may output the output signal of the NAND gate 201_1 by inverting and buffering the output signal of the NAND gate 201_1. The inverter 203_1 may output the output signal of the NAND gate 201_2 by inverting and buffering the output signal of the NAND gate 201_2. The inverter 203_2 may output the forward signal FS by inverting and buffering the forward signal FS. The inverter 203_2 may output the output signal of the inverter 203_1 as the first internal detection signal ICHS1 by inverting and buffering the output signal of the inverter 203_1 when the logic level of the forward signal FS is activated to a logic high level. The NAND gate 201_3 may perform a NAND operation by receiving the first internal detection signal ICHS1 and the source voltage VDD. The NAND gate 201_3 may output the first internal detection signal ICHS1 by inverting and buffering the first internal detection signal ICHS1. The NAND gate 201_4 may perform a NAND operation by receiving the output signal of the NAND gate 201_3 and the source voltage VDD. The NAND gate 201_4 may output the output signal of the NAND gate 201_3 by inverting and buffering the output signal of the NAND gate 201_3. The inverter 203_4 may output the output signal of the NAND gate 201_4 by inverting and buffering the output signal of the NAND gate 201_4. The inverter 203_5 may output the backward signal BS by inverting and buffering the backward signal BS. The inverter 203_6 may output the output signal of the inverter 203_4 as the first external detection signal ECHS1 by inverting and buffering the output signal of the inverter 203_4 when the logic level of the backward signal BS is activated to a logic high level.

The first crack detection circuit 101A that is constructed as described above may output the first external detection signal ECHS1 as the first internal detection signal ICHS1 by buffering the first external detection signal ECHS1 through the NAND gates 201_1 and 201_2 and the inverters 203_1 and 203_3 when the logic level of the forward signal FS is activated to a logic high level. Furthermore, the first crack detection circuit 101 may output the first internal detection signal ICHS1 as the first external detection signal ECHS1 by buffering the first internal detection signal ICHS1 through the NAND gates 201_3 and 201_4 and the inverters 203_4 and 203_6 when the logic level of the backward signal BS is activated to a logic high level.

Figure 3:
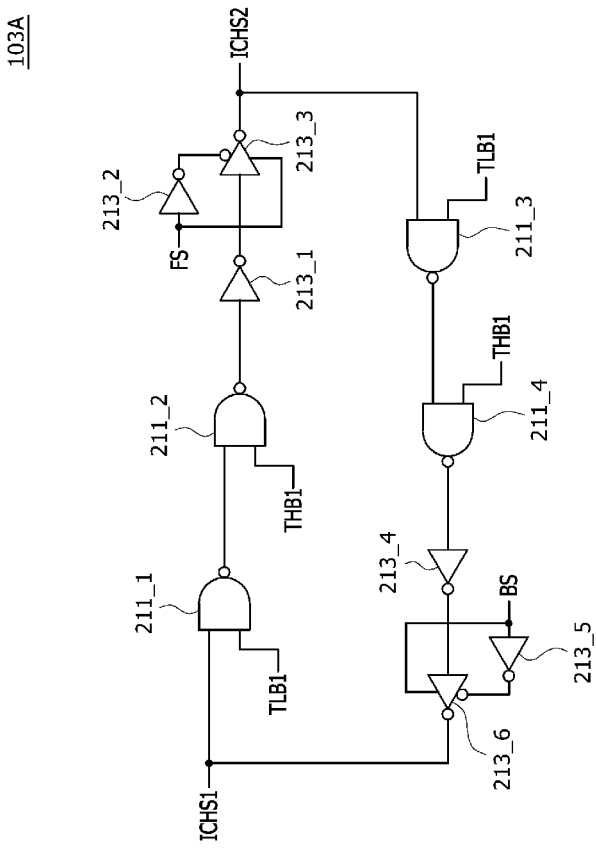
FIG. 3 is a circuit diagram of a second crack detection circuit according to an example of the present disclosure.

FIG. 3 is a circuit diagram of a second crack detection circuit 103A according to an example of the second crack detection circuit 103. As illustrated in FIG. 3, the second crack detection circuit 103A may include NAND gates 211_1 to 211_4 and inverters 213_1 to 213_6. The NAND gate 211_1 may perform a NAND operation by receiving the first internal detection signal ICHS1 and the first low setting signal TLB1. The NAND gate 211_1 may output a logic high level when the logic level of the first low setting signal TLB1 is activated to a logic low level and may output the first internal detection signal ICHS1 by inverting and buffering the first internal detection signal ICHS1 when the logic level of the first low setting signal TLB1 is inactivated to a logic high level. The NAND gate 211_2 may perform a NAND operation by receiving the output signal of the NAND gate 211_1 and the first high setting signal THB1. The NAND gate 211_2 may output a logic high level when the logic level of the first high setting signal THB1 is activated to a logic low level and may output the output signal of the NAND gate 211_1 by inverting and buffering the output signal of the NAND gate 211_1 when the logic level of the first high setting signal THB1 is inactivated to a logic high level. The inverter 213_1 may output the output signal of the NAND gate 211_2 by inverting and buffering the output signal of the NAND gate 211_2. The inverter 213_2 may output the forward signal FS by inverting and buffering the forward signal FS. The inverter 213_2 may output the output signal of the inverter 213_1 as the second internal detection signal ICHS2 by inverting and buffering the output signal of the inverter 213_1 when the logic level of the forward signal FS is activated to a logic high level. The NAND gate 211_3 may perform a NAND operation by receiving the second internal detection signal ICHS2 and the first low setting signal TLB1. The NAND gate 211_3 may output a logic high level when the logic level of the first low setting signal TLB1 is activated to a logic low level and may output the second internal detection signal ICHS2 by inverting and buffering the second internal detection signal ICHS2 when the logic level of the first low setting signal TLB1 is inactivated to a logic high level. The NAND gate 211_4 may perform a NAND operation by receiving the output signal of the NAND gate 211_3 and the first high setting signal THB1. The NAND gate 211_4 may output a logic high level when the logic level of the first high setting signal THB1 is activated to a logic low level and may output the output signal of the NAND gate 211_3 by inverting and buffering the output signal of the NAND gate 211_3 when the logic level of the first high setting signal THB1 is inactivated to a logic high level. The inverter 213_4 may output the output signal of the NAND gate 211_4 by inverting and buffering the output signal of the NAND gate 211_4. The inverter 213_5 may output the backward signal BS by inverting and buffering the backward signal BS. The inverter 213_6 may output the output signal of the inverter 213_4 as the first internal detection signal ICHS1 by inverting and buffering the output signal of the inverter 213_4 when the logic level of the backward signal BS is activated to a logic high level.

The second crack detection circuit 103A, illustrated in FIG. 3, may output the first internal detection signal ICHS1 as the second internal detection signal ICHS2 by buffering the first internal detection signal ICHS1 through the NAND gates 211_1 and 211_2 and the inverters 213_1 and 213_3 when the logic level of the forward signal FS is activated to a logic high level based on the logic levels of the first high setting signal THB1 and the first low setting signal TLB1 having been inactivated to a logic high level. Furthermore, in the second crack detection circuit 103A, when the logic level of the first high setting signal THB1 is activated to a logic low level and the logic level of the forward signal FS is activated to a logic high level, the output signal of the NAND gate 211_2 that outputs a logic high level may be buffered through the inverters 213_1 and 213_3, and the logic level of the second internal detection signal ICHS2 may be set to a logic high level. Furthermore, in the second crack detection circuit 103A, when the logic level of the first low setting signal TLB1 is activated to a logic low level and the logic level of the forward signal FS is activated to a logic high level, the output signal of the NAND gate 211_1 that outputs a logic high level may be inverted and buffered through the NAND gate 211_2 and the inverters 213_1 and 213_3, and the logic level of the second internal detection signal ICHS2 may be set to a logic low level. Furthermore, when the logic level of the backward signal BS is activated to a logic high level based on the logic levels of the first high setting signal THB1 and the first low setting signal TLB1 having been inactivated to a logic high level, the second crack detection circuit 103A may output the second internal detection signal ICHS2 as the first internal detection signal ICHS1 by buffering the second internal detection signal ICHS2 through the NAND gates 211_3 and 211_4 and the inverters 213_4 and 213_6. Furthermore, in the second crack detection circuit 103A, when the logic level of the first high setting signal THB1 is activated to a logic low level and the logic level of the backward signal BS is activated to a logic high level, the output signal of the NAND gate 211_4 that outputs a logic high level may be buffered through the inverters 213_4 and 213_6, and the logic level of the first internal detection signal ICHS1 may be set to a logic high level. Furthermore, in the second crack detection circuit 103A, when the logic level of the first low setting signal TLB1 is activated to a logic low level and the logic level of the backward signal BS is activated to a logic high level, the output signal of the NAND gate 211_3 that outputs a logic high level may be inverted and buffered through the NAND gate 211_4 and the inverters 213_4 and 213_6, and the logic level of the first internal detection signal ICHS1 may be set to a logic low level.

Operations of the first internal detection signal ICHS1 and the second internal detection signal ICHS2 in the second crack detection circuit 103A are described more specifically with reference to FIG. 4. As illustrated in FIG. 4, when the logic level of the first high setting signal THB1 is activated to a logic low level "L" based on the logic level of the forward signal FS having been activated to a logic high level "H" and the logic level of the backward signal BS having been inactivated to a logic low level "L", the NAND gate 211_2 may output a logic high level "H" regardless of a logic level of the first low setting signal TLB1. Accordingly, the logic level of the second internal detection signal ICHS2 may be set as a logic high level "H" regardless of the first internal detection signal ICHS1. Furthermore, when the logic level of the first low setting signal TLB1 is activated to a logic low level "L" and the logic level of the first high setting signal THB1 is inactivated to a logic high level "H" based on the logic level of the forward signal FS having been activated to a logic high level "H" and the logic level of the backward signal BS having been inactivated to a logic low level "L", the NAND gate 211_1 may output a logic high level "H" and the NAND gate 211_1 may output a logic low level "L". Accordingly, the logic level of the second internal detection signal ICHS2 may be set as a logic low level "L" regardless of the first internal detection signal ICHS1. Furthermore, when the logic level of the first high setting signal THB1 is activated to a logic low level "L" based on the logic level of the backward signal BS having been activated to a logic high level "H" and the logic level of the forward signal FS having been inactivated to a logic low level "L", the NAND gate 211_4 may output a logic high level "H" regardless of a logic level of the first low setting signal TLB1. Accordingly, the logic level of the first internal detection signal ICHS1 may be set as a logic high level "H" regardless of the second internal detection signal ICHS2. Furthermore, when the logic level of the first low setting signal TLB1 is activated to a logic low level "L" and the logic level of the first high setting signal THB1 is inactivated to a logic high level "H" based on the logic level of the backward signal BS having been activated to a logic high level "H" and the logic level of the forward signal FS having been inactivated to a logic low level "L", the NAND gate 211_3 may output a logic high level "H", and the NAND gate 211_4 may output a logic low level "L". Accordingly, the logic level of the first internal detection signal ICHS1 may be set as a logic low level "L" regardless of the second internal detection signal ICHS2.

FIGS. 5 to 18 are timing diagrams for describing a crack detection operation that is performed in the semiconductor device 10.

Figure 5:
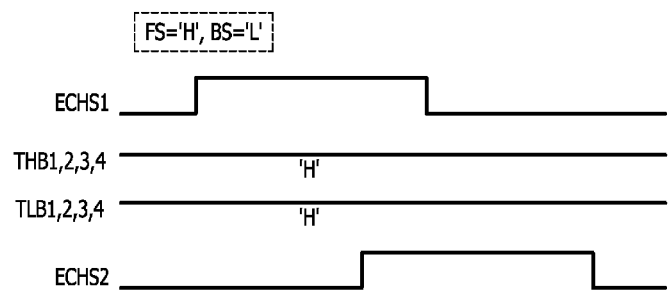
FIGS. 5 to 18 are timing diagrams for describing a crack detection operation that is performed in the semiconductor device according to an example of the present disclosure.
Figure 6:
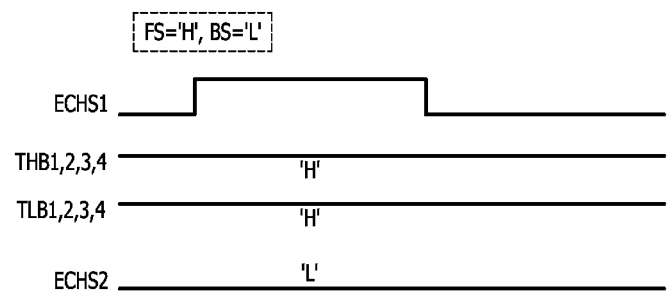

As illustrated in FIGS. 5 and 6, a crack detection operation according to an example may be performed in a way that a pulse of the first external detection signal ECHS1 that is applied by the external device (not illustrated) is transmitted through the first metal line ML1, the second metal line ML2, the third metal line ML3, and the fourth metal line ML4 and the external device (not illustrated) receives the second external detection signal ECHS2 when the logic levels of all of the first to fourth high setting signals THB1 to THB4 and the first to fourth low setting signals TLB1 to TLB4 have been inactivated to a logic high level "H" when the logic level of the forward signal FS has been activated to a logic high level "H" and the logic level of the backward signal BS has been inactivated to a logic low level "L". As illustrated in FIG. 5, it may be seen that when a pulse of the first external detection signal ECHS1 is transferred to the second external detection signal ECHS2 that has been received from the external device (not illustrated), a crack is not present in the first metal line ML1, the second metal line ML2, the third metal line ML3, and the fourth metal line ML4. As illustrated in FIG. 6, it may be seen that when a pulse of the first external detection signal ECHS1 is not transferred to the second external detection signal ECHS2 that has been received from the external device (not illustrated) and the logic level of the second external detection signal ECHS2 is maintained to a logic low level "L", a crack is present in at least one of the first metal line ML1, the second metal line ML2, the third metal line ML3, and the fourth metal line ML4.

Figure 7:
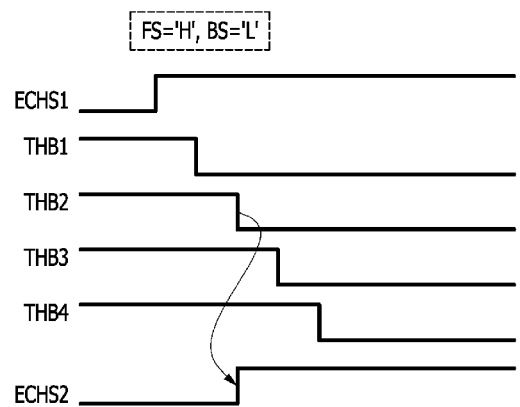
Figure 8:
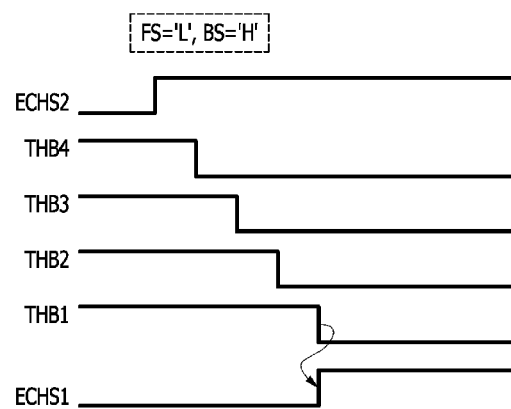

As illustrated in FIGS. 7 and 8, a crack detection operation according to another example may be performed in a way to check the logic level of the second external detection signal ECHS2 while sequentially activating the logic levels of the first high setting signal THB1, the second high setting signal THB2, the third high setting signal THB3, and the fourth high setting signal THB4 to a logic low level "L" when the logic level of the forward signal FS has been activated to a logic high level "H" and the logic level of the backward signal BS has been inactivated to a logic low level "L" and then to check the logic level of the first external detection signal ECHS1 while sequentially activating the logic levels of the fourth high setting signal THB4, the third high setting signal THB3, the second high setting signal THB2, and the first high setting signal THB1 to a logic low level "L" when the logic level of the backward signal BS has been activated to a logic high level "H" and the logic level of the forward signal FS has been inactivated to a logic low level "L". As illustrated in FIG. 7, it may be seen that when the logic level of the second high setting signal THB2 is activated to a logic low level "L" based on the logic level of the forward signal FS having been activated to a logic high level "H" and the logic level of the backward signal BS having been inactivated to a logic low level "L", a crack is not present in the third metal line ML3 and the fourth metal line ML4 because the logic level of the second external detection signal ECHS2 is activated to a logic high level "H". Furthermore, as illustrated in FIG. 8, it may be seen that when the logic level of the first high setting signal THB1 is activated to a logic low level "L" based on the logic level of the backward signal BS having been activated to a logic high level "H" and the logic level of the forward signal FS having been inactivated to a logic low level "L", a crack is not present in the first metal line ML1 because the logic level of the first external detection signal ECHS1 is activated to a logic high level "H". Accordingly, it may be checked that a crack is present in the second metal line ML2 by the crack detection operation, illustrated in FIGS. 7 and 8.

Figure 9:
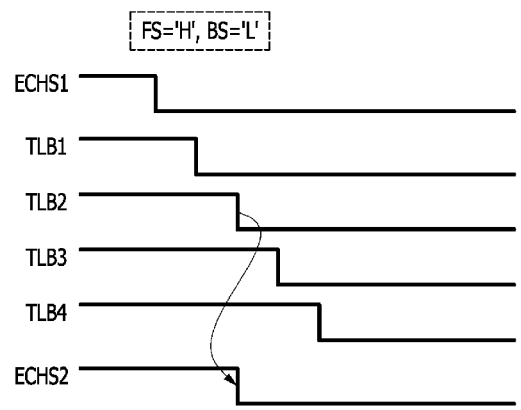
Figure 10:
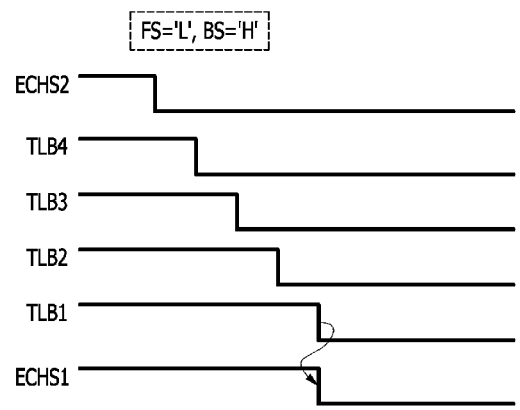

As illustrated in FIGS. 9 and 10, a crack detection operation according to still another example may be performed in a way to check the logic level of the second external detection signal ECHS2 while sequentially activating the logic levels of the first low setting signal TLB1, the second low setting signal TLB2, the third low setting signal TLB3, and the fourth low setting signal TLB4 to a logic low level "L" when the logic level of the forward signal FS has been activated to a logic high level "H" and the logic level of the backward signal BS has been inactivated to a logic low level "L" and then to check the logic level of the first external detection signal ECHS1 while sequentially activating the logic levels of the fourth low setting signal TLB4, the third low setting signal TLB3, the second low setting signal TLB2, and the first low setting signal TLB1 to a logic low level "L" when the logic level of the backward signal BS has been activated to a logic high level "H" and the logic level of the forward signal FS has been inactivated to a logic low level "L". As illustrated in FIG. 9, it may be seen that when the logic level of the second low setting signal TLB2 is activated to a logic low level "L" based on the logic level of the forward signal FS having been activated to a logic high level "H" and the logic level of the backward signal BS having been inactivated to a logic low level "L", a crack is not present in the third metal line ML3 and the fourth metal line ML4 because the logic level of the second external detection signal ECHS2 is activated to a logic low level "L". Furthermore, as illustrated in FIG. 10, it may be seen that when the logic level of the first low setting signal TLB1 is activated to a logic low level "L" based on the logic level of the backward signal BS having been activated to a logic high level "H" and the logic level of the forward signal FS having been inactivated to a logic low level "L", a crack is not present in the first metal line ML1 because the logic level of the first external detection signal ECHS1 is activated to a logic low level "L". Accordingly, it may be checked that a crack is present in the second metal line ML2 by the crack detection operation, illustrated in FIGS. 9 and 10.

Figure 11:
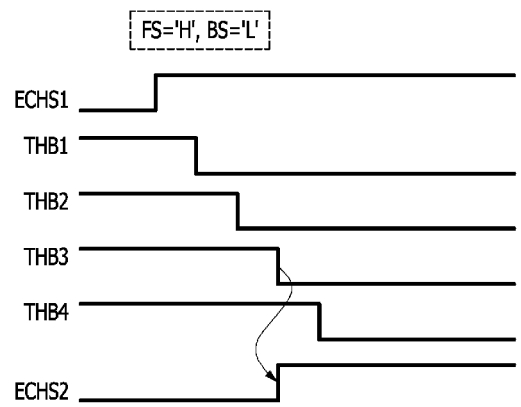
Figure 12:
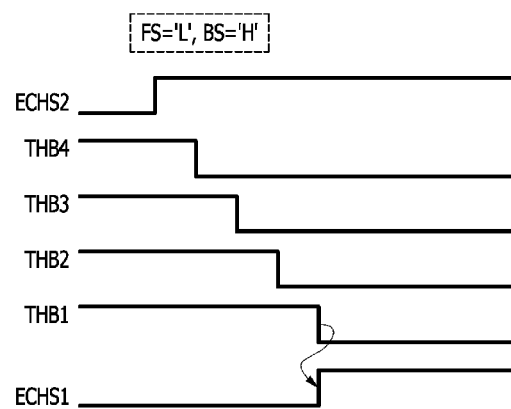

As illustrated in FIGS. 11 and 12, a crack detection operation according to still another example may be performed in a way to check the logic level of the second external detection signal ECHS2 while sequentially activating the logic levels of the first high setting signal THB1, the second high setting signal THB2, the third high setting signal THB3, and the fourth high setting signal THB4 to a logic low level "L" when the logic level of the forward signal FS has been activated to a logic high level "H" and the logic level of the backward signal BS has been inactivated to a logic low level "L" and then to check the logic level of the first external detection signal ECHS1 while sequentially activating the logic levels of the fourth high setting signal THB4, the third high setting signal THB3, the second high setting signal THB2, and the first high setting signal THB1 to a logic low level "L" based on the logic level of the backward signal BS having been activated to a logic high level "H" and the logic level of the forward signal FS having been inactivated to a logic low level "L". As illustrated in FIG. 11, it may be seen that when the logic level of the third high setting signal THB3 is activated to a logic low level "L" based on the logic level of the forward signal FS having been activated to a logic high level "H" and the logic level of the backward signal BS having been inactivated to a logic low level "L", a crack is not present in the fourth metal line ML4 because the logic level of the second external detection signal ECHS2 is activated to a logic high level "H". Furthermore, as illustrated in FIG. 12, it may be seen that when the logic level of the first high setting signal THB1 is activated to a logic low level "L" based on the logic level of the backward signal BS having been activated to a logic high level "H" and the logic level of the forward signal FS having been inactivated to a logic low level "L", a crack is not present in the first metal line ML1 because the logic level of the first external detection signal ECHS1 is activated to a logic high level "H". Accordingly, it may be checked that a crack is present in the second metal line ML2 and the third metal line ML3 by the crack detection operation, illustrated in FIGS. 11 and 12.

Figure 13:
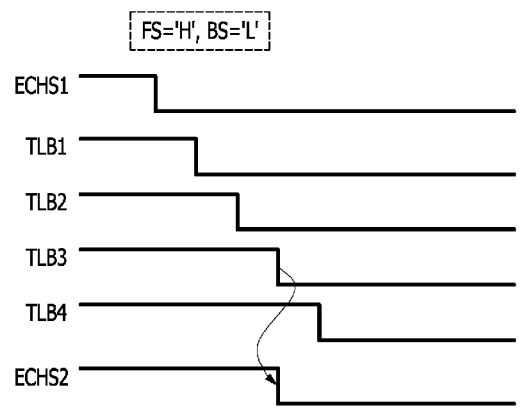
Figure 14:
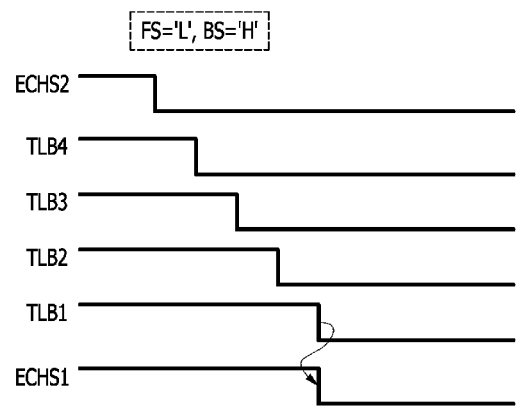

As illustrated in FIGS. 13 and 14, a crack detection operation according to another example may be performed in a way to check the logic level of the second external detection signal ECHS2 while sequentially activating the logic levels of the first low setting signal TLB1, the second low setting signal TLB2, the third low setting signal TLB3, and the fourth low setting signal TLB4 to a logic low level "L" when the logic level of the forward signal FS has been activated to a logic high level "H" and the logic level of the backward signal BS has been inactivated to a logic low level "L" and then to check the logic level of the first external detection signal ECHS1 while sequentially activating the logic levels of the fourth low setting signal TLB4, the third low setting signal TLB3, the second low setting signal TLB2, and the first low setting signal TLB1 to a logic low level "L" when the logic level of the backward signal BS has been activated to a logic high level "H" and the logic level of the forward signal FS has been inactivated to a logic low level "L". As illustrated in FIG. 13, it may be seen that when the logic level of the third low setting signal TLB3 is activated to a logic low level "L" based on the logic level of the forward signal FS having been activated to a logic high level "H" and the logic level of the backward signal BS having been inactivated to a logic low level "L", a crack is not present in the fourth metal line ML4 because the logic level of the second external detection signal ECHS2 is activated to a logic low level "L". Furthermore, as illustrated in FIG. 14, it may be seen that when the logic level of the first low setting signal TLB1 is activated to a logic low level "L" based on the logic level of the backward signal BS having been activated to a logic high level "H" and the logic level of the forward signal FS having been inactivated to a logic low level "L", a crack is not present in the first metal line ML1 because the logic level of the first external detection signal ECHS1 is activated to a logic low level "L". Accordingly, it may be checked that a crack is present in the second metal line ML2 and the third metal line ML3 by the crack detection operation, illustrated in FIGS. 13 and 14.

Figure 15:
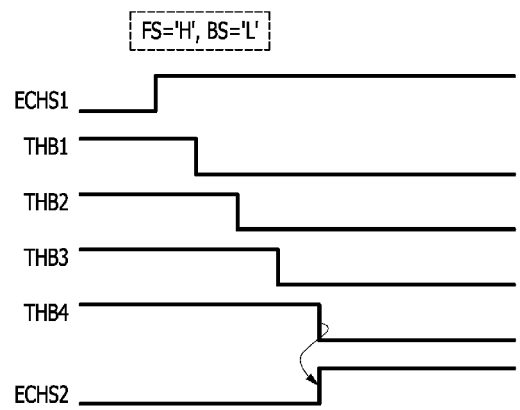
Figure 16:
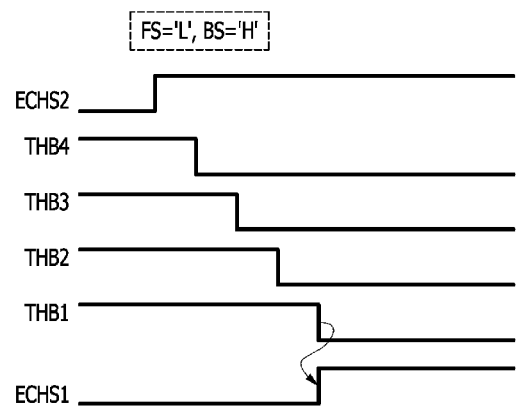

As illustrated in FIGS. 15 and 16, a crack detection operation according to still another example may be performed in a way to check the logic level of the second external detection signal ECHS2 while sequentially activating the logic levels of the first high setting signal THB1, the second high setting signal THB2, the third high setting signal THB3, and the fourth high setting signal THB4 to a logic low level "L" when the logic level of the forward signal FS has been activated to a logic high level "H" and the logic level of the backward signal BS has been inactivated to a logic low level "L" and then to check the logic level of the first external detection signal ECHS1 while sequentially activating the logic levels of the fourth high setting signal THB4, the third high setting signal THB3, the second high setting signal THB2, and the first high setting signal THB1 to a logic low level "L" when the logic level of the backward signal BS has been activated to a logic high level "H" and the logic level of the forward signal FS has been inactivated to a logic low level "L". As illustrated in FIG. 15, it may be seen that when the logic level of the fourth high setting signal THB4 is activated to a logic low level "L" based on the logic level of the forward signal FS having been activated to a logic high level "H" and the logic level of the backward signal BS having been inactivated to a logic low level "L", a crack is present in the fourth metal line ML4 because the logic level of the second external detection signal ECHS2 is activated to a logic high level "H". Furthermore, as illustrated in FIG. 16, it may be seen that when the logic level of the first high setting signal THB1 is activated to a logic low level "L" based on the logic level of the backward signal BS having been activated to a logic high level "H" and the logic level of the forward signal FS having been inactivated to a logic low level "L", a crack is not present in the first metal line ML1 because the logic level of the first external detection signal ECHS1 is activated to a logic high level "H". Accordingly, it may be checked that a crack is present in the second metal line ML2 and the fourth metal line ML4 by the crack detection operation, illustrated in FIGS. 15 and 16.

Figure 17:
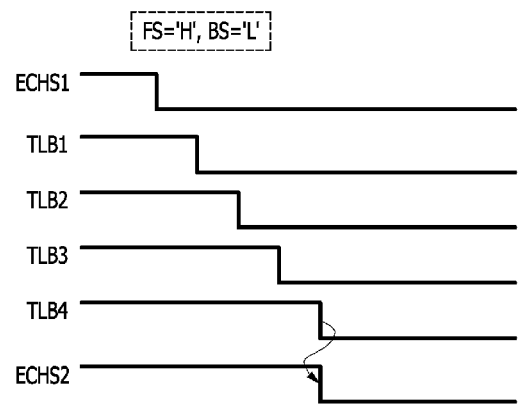
Figure 18:
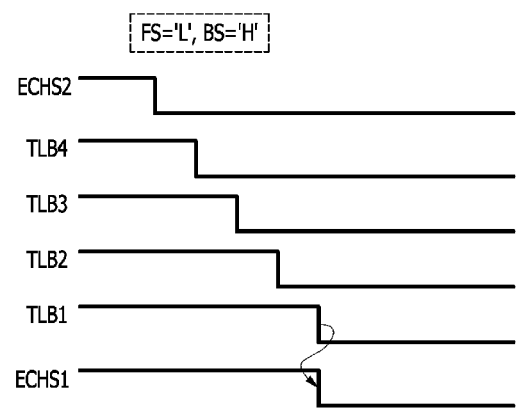

As illustrated in FIGS. 17 and 18, a crack detection operation according to still another example may be performed in a way to check the logic level of the second external detection signal ECHS2 while sequentially activating the logic levels of the first low setting signal TLB1, the second low setting signal TLB2, the third low setting signal TLB3, and the fourth low setting signal TLB4 to a logic low level) "L" when the logic level of the forward signal FS has been activated to a logic high level "H" and the logic level of the backward signal BS has been inactivated to a logic low level "L" and then to check the logic level of the first external detection signal ECHS1 while sequentially activating the logic levels of the fourth low setting signal TLB4, the third low setting signal TLB3, the second low setting signal TLB2, and the first low setting signal TLB1 to a logic low level "L" when the logic level of the backward signal BS has been activated to a logic high level "H" and the logic level of the forward signal FS has been inactivated to a logic low level "L". As illustrated in FIG. 17, it may be seen that when the logic level of the fourth low setting signal TLB4 is activated to a logic low level "L" based on the logic level of the forward signal FS having been activated to a logic high level "H" and the logic level of the backward signal BS having been inactivated to a logic low level "L", a crack is present in the fourth metal line ML4 because the logic level of the second external detection signal ECHS2 is activated to a logic low level "L". Furthermore, as illustrated in FIG. 18, it may be seen that when the logic level of the first low setting signal TLB1 is activated to a logic low level "L" based on the logic level of the backward signal BS having been activated to a logic high level "H" and the logic level of the forward signal FS having been inactivated to a logic low level "L", a crack is not present in the first metal line ML1 because the logic level of the first external detection signal ECHS1 is activated to a logic low level "L". Accordingly, it may be checked that a crack is present in the second metal line ML2 and the fourth metal line ML4 by the crack detection operation, illustrated in FIGS. 17 and 18.

Figure 19:
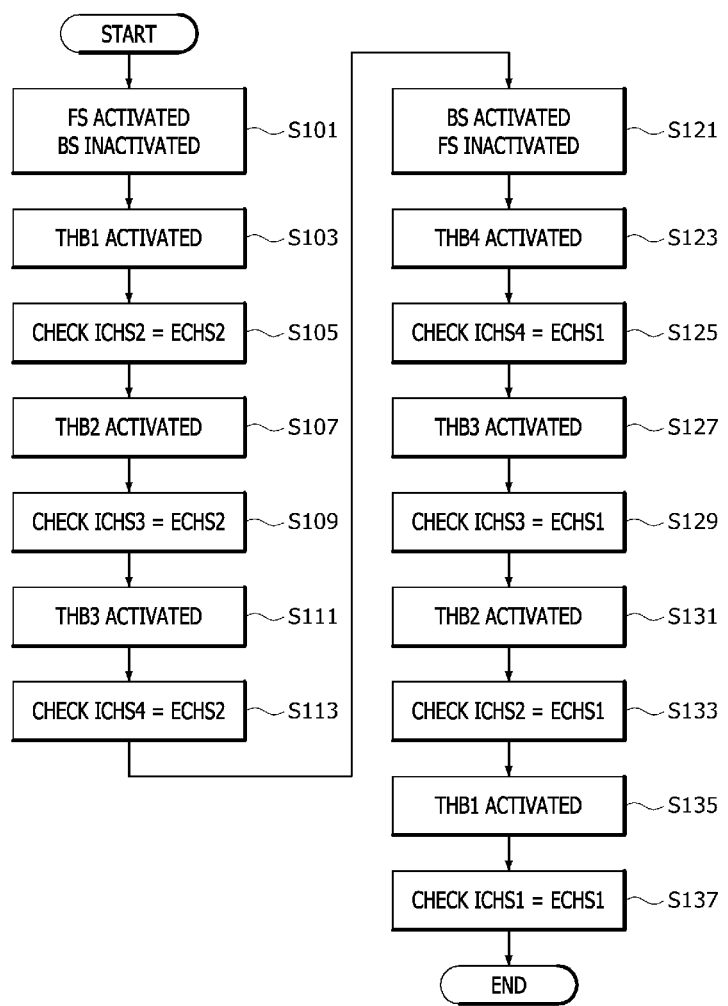
FIG. 19 is a flowchart for describing an example of a method of a crack detection operation being performed in the semiconductor device according to an example of the present disclosure.

An example of a method of a crack detection operation being performed in the semiconductor device 10 is described as follows with reference to a flowchart, illustrated in FIG. 19.

First, by activating the first high setting signal THB1 (S103) when the forward signal FS has been activated and the backward signal BS has been inactivated (S101), the logic level of the second internal detection signal ICHS2 may be activated to a logic high level, and whether the second internal detection signal ICHS2 is transferred as the second external detection signal ECHS2 through the third internal detection signal ICHS3 and the fourth internal detection signal ICHS4 may be checked (S105). It may be checked that when the second external detection signal ECHS2 is output at the same logic level as the second internal detection signal ICHS2, a crack is not present in the second metal line ML2, the third metal line ML3, and the fourth metal line ML4. It may be checked that when the second external detection signal ECHS2 is output at a logic level that is different from the logic level of the second internal detection signal ICHS2, a crack is present in one of the second metal line ML2, the third metal line ML3, and the fourth metal line ML4.

Next, by activating the second high setting signal THB2 (S107) when the forward signal FS has been activated and the backward signal BS has been inactivated (S101), the logic level of the third internal detection signal ICHS3 may be activated to a logic high level, and whether the third internal detection signal ICHS3 is transferred as the second external detection signal ECHS2 through the fourth internal detection signal ICHS4 may be checked (S109). It may be checked that when the second external detection signal ECHS2 is output at the same logic level as the third internal detection signal ICHS3, a crack is not present in the third metal line ML3 and the fourth metal line ML4. It may be checked that when the second external detection signal ECHS2 is output at a logic level that is different from the logic level of the third internal detection signal ICHS3, a crack is present in one of the third metal line ML3 and the fourth metal line ML4.

Next, by activating the third high setting signal THB3 (S111) when the forward signal FS has been activated and the backward signal BS has been inactivated (S101), the logic level of the fourth internal detection signal ICHS4 may be activated to a logic high level, and whether the fourth internal detection signal ICHS4 is transferred as the second external detection signal ECHS2 may be checked (S113). It may be checked that when the second external detection signal ECHS2 is output at the same logic level as the fourth internal detection signal ICHS4, a crack is not present in the fourth metal line ML4. It may be checked that when the second external detection signal ECHS2 is output at a logic level that is different from the logic level of the fourth internal detection signal ICHS4, a crack is present in the fourth metal line ML4.

Next, by activating the fourth high setting signal THB4 (S123) when the backward signal BS has been activated and the forward signal FS has been inactivated (S121), the logic level of the fourth internal detection signal ICHS4 may be activated to a logic high level, and whether the fourth internal detection signal ICHS4 is transferred as the first external detection signal ECHS1 through the third internal detection signal ICHS3, the second internal detection signal ICHS2, and the first internal detection signal ICHS1 may be checked (S125). It may be checked that when the first external detection signal ECHS1 is output at the same logic level as the fourth internal detection signal ICHS4, a crack is not present in the first metal line ML1, the second metal line ML2, the third metal line ML3, and the fourth metal line ML4. It may be checked that when the first external detection signal ECHS1 is output at a logic level that is different from the logic level of the fourth internal detection signal ICHS4, a crack is present in one of the first metal line ML1, the second metal line ML2, the third metal line ML3, and the fourth metal line ML4.

Next, by activating the third high setting signal THB3 (S127) when the backward signal BS has been activated and the forward signal FS has been inactivated (S121), the logic level of the third internal detection signal ICHS3 may be activated to a logic high level, and whether the third internal detection signal ICHS3 is transferred as the first external detection signal ECHS1 through the second internal detection signal ICHS2 and the first internal detection signal ICHS1 may be checked (S129). It may be checked that when the first external detection signal ECHS1 is output at the same logic level as the third internal detection signal ICHS3, a crack is not present in the first metal line ML1, the second metal line ML2, and the third metal line ML3. It may be checked that when the first external detection signal ECHS1 is output at a logic level that is different from the logic level of the third internal detection signal ICHS3, a crack is present in one of the first metal line ML1, the second metal line ML2, and the third metal line ML3.

Next, by activating the second high setting signal THB2 (S131) when the backward signal BS has been activated and the forward signal FS has been inactivated (S121), the logic level of the second internal detection signal ICHS2 may be activated to a logic high level, and whether the second internal detection signal ICHS2 is transferred as the first external detection signal ECHS1 through the first internal detection signal ICHS1 may be checked (S133). It may be checked that when the first external detection signal ECHS1 is output at the same logic level as the second internal detection signal ICHS2, a crack is not present in the first metal line ML1 and the second metal line ML2. It may be checked that when the first external detection signal ECHS1 is output at a logic level that is different from the logic level of the second internal detection signal ICHS2, a crack is present in one of the first metal line ML1 and the second metal line ML2.

Finally, by activating the first high setting signal THB1 (S135) when the backward signal BS has been activated and the forward signal FS has been inactivated (S121), the logic level of the first internal detection signal ICHS1 may be set to a logic high level, and whether the first internal detection signal ICHS1 is transferred as the first external detection signal ECHS1 may be checked (S137). It may be checked that when the first external detection signal ECHS1 is output at the same logic level as the first internal detection signal ICHS1, a crack is not present in the first metal line ML1. It may be checked that when the first external detection signal ECHS1 is output at a logic level that is different from the logic level of the first internal detection signal ICHS1, a crack is present in the first metal line ML1.

Figure 20:
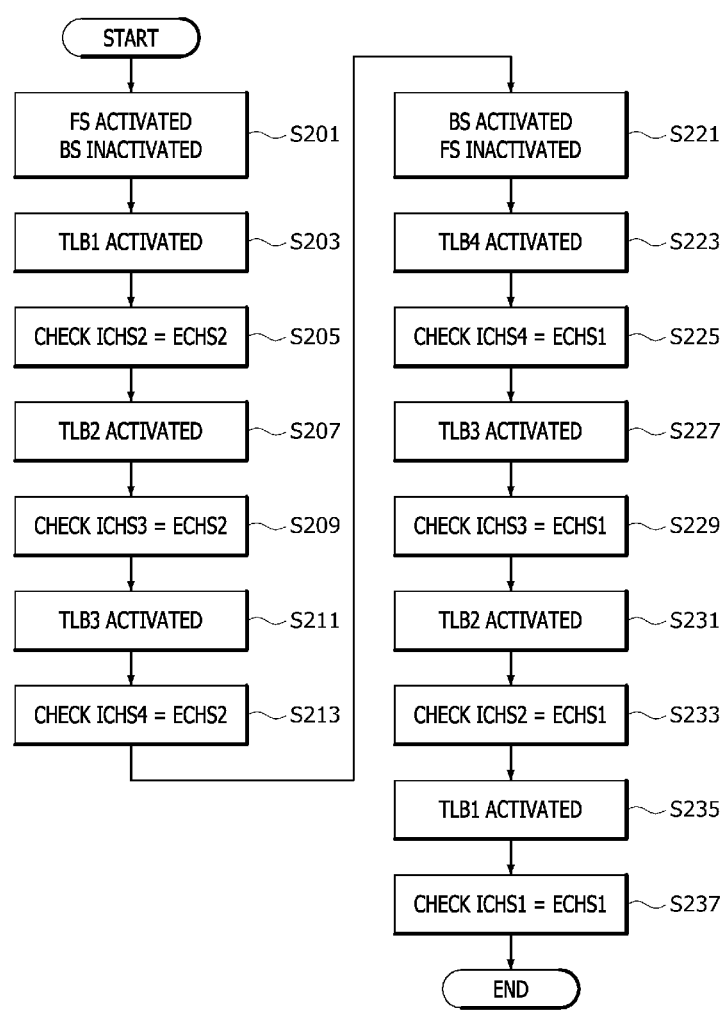
FIG. 20 is a flowchart for describing another example of a method of a crack detection operation being performed in the semiconductor device according to an example of the present disclosure.

Another example of a method of a crack detection operation being performed in the semiconductor device 10 is described as follows with reference to a flowchart, illustrated in FIG. 20.

First, by activating the first low setting signal TLB1 (S203) when the forward signal FS has been activated and the backward signal BS has been inactivated (S201), the logic level of the second internal detection signal ICHS2 may be set as a logic low level, and whether the second internal detection signal ICHS2 is transferred as the second external detection signal ECHS2 through the third internal detection signal ICHS3 and the fourth internal detection signal ICHS4 may be checked (S205). It may be checked that when the second external detection signal ECHS2 is output at the same logic level as the second internal detection signal ICHS2, a crack is not present in the second metal line ML2, the third metal line ML3, and the fourth metal line ML4. It may be checked that when the second external detection signal ECHS2 is output at a logic level that is different from the logic level of the second internal detection signal ICHS2, a crack is present in one of the second metal line ML2, the third metal line ML3, and the fourth metal line ML4.

Next, by activating the second low setting signal TLB2 (S207) when the forward signal FS has been activated and the backward signal BS has been inactivated (S201), the logic level of the third internal detection signal ICHS3 may be set as a logic low level, and whether the third internal detection signal ICHS3 is transferred as the second external detection signal ECHS2 through the fourth internal detection signal ICHS4 may be checked (S209). It may be checked that when the second external detection signal ECHS2 is output at the same logic level as the third internal detection signal ICHS3, a crack is not present in the third metal line ML3 and the fourth metal line ML4. It may be checked that when the second external detection signal ECHS2 is output at a logic level that is different from the logic level of the third internal detection signal ICHS3, a crack is present in one of the third metal line ML3 and the fourth metal line ML4.

Next, by activating the third low setting signal TLB3 (S211) when the forward signal FS has been activated and the backward signal BS has been inactivated (S201), the logic level of the fourth internal detection signal ICHS4 may be set as a logic low level, and whether the fourth internal detection signal ICHS4 is transferred as the second external detection signal ECHS2 may be checked (S213). It may be checked that when the second external detection signal ECHS2 is output at the same logic level as the fourth internal detection signal ICHS4, a crack is not present in the fourth metal line ML4. It may be checked that when the second external detection signal ECHS2 is output at a logic level that is different from the logic level of the fourth internal detection signal ICHS4, a crack is present in the fourth metal line ML4.

Next, by activating the fourth low setting signal TLB4 (S223) when the backward signal BS has been activated and the forward signal FS has been inactivated (S221), the logic level of the fourth internal detection signal ICHS4 may be set as a logic low level, and whether the fourth internal detection signal ICHS4 is transferred as the first external detection signal ECHS1 through the third internal detection signal ICHS3, the second internal detection signal ICHS2, and the first internal detection signal ICHS1 may be checked (S225). It may be checked that when the first external detection signal ECHS1 is output at the same logic level as the fourth internal detection signal ICHS4, a crack is not present in the first metal line ML1, the second metal line ML2, the third metal line ML3, and the fourth metal line ML4. It may be checked that when the first external detection signal ECHS1 is output at a logic level that is different from the logic level of the fourth internal detection signal ICHS4, a crack is present in one of the first metal line ML1, the second metal line ML2, the third metal line ML3, and the fourth metal line ML4.

Next, by activating the third low setting signal TLB3 (S227) when the backward signal BS has been activated and the forward signal FS has been inactivated (S221), the logic level of the third internal detection signal ICHS3 may be set as a logic low level, and whether the third internal detection signal ICHS3 is transferred as the first external detection signal ECHS1 through the second internal detection signal ICHS2 and the first internal detection signal ICHS1 may be checked (S229). It may be checked that when the first external detection signal ECHS1 is output at the same logic level as the third internal detection signal ICHS3, a crack is not present in the first metal line ML1, the second metal line ML2, and the third metal line ML3. It may be checked that when the first external detection signal ECHS1 is output at a logic level that is different from the logic level of the third internal detection signal ICHS3, a crack is present in one of the first metal line ML1, the second metal line ML2, and the third metal line ML3.

Next, by activating the second low setting signal TLB2 (S231) when the backward signal BS has been activated and the forward signal FS has been inactivated (S221), the logic level of the second internal detection signal ICHS2 may be set as a logic low level, and whether the second internal detection signal ICHS2 is transferred as the first external detection signal ECHS1 through the first internal detection signal ICHS1 may be checked (S233). It may be checked that when the first external detection signal ECHS1 is output at the same logic level as the second internal detection signal ICHS2, a crack is not present in the first metal line ML1 and the second metal line ML2. It may be checked that when the first external detection signal ECHS1 is output at a logic level that is different from the logic level of the second internal detection signal ICHS2, a crack is present in one of the first metal line ML1 and the second metal line ML2.

Finally, by activating the first low setting signal TLB1 (S235) when the backward signal BS has been activated and the forward signal FS has been inactivated (S221), the logic level of the first internal detection signal ICHS1 may be set as a logic low level, and whether the first internal detection signal ICHS1 is transferred as the first external detection signal ECHS1 may be checked (S237). It may be checked that when the first external detection signal ECHS1 is output at the same logic level as the first internal detection signal ICHS1, a crack is not present in the first metal line ML1. It may be checked that when the first external detection signal ECHS1 is output at a logic level that is different from the logic level of the first internal detection signal ICHS1, a crack is present in the first metal line ML1.

The semiconductor device 10 that has been described with reference to FIG. 1 may be applied to electronic systems which may include a memory system, a graphic system, a computing system, and a mobile system. For example, referring to FIG. 21, an electronic system 1000 according to an embodiment of the present disclosure may include a data storage unit 1001, a memory controller 1002, buffer memory 1003, and an input and output (I/O) interface 1004.

The data storage unit 1001 may store data (not illustrated) that is applied by the memory controller 1002 in response to a control signal from the memory controller 1002, may read data (not illustrated) that has been stored in the data storage unit 1001 and may output the read data to the memory controller 1002. The data storage unit 1001 may include nonvolatile memory capable of continuously storing data without losing the data although power is blocked. The nonvolatile memory may be implemented as flash memory (e.g., NOR flash memory or NAND flash memory), phase change random access memory (PRAM), resistive random access memory (RRAM), spin transfer torque random access memory (STTRAM), or magnetic random access memory (MRAM).

Figure 21:
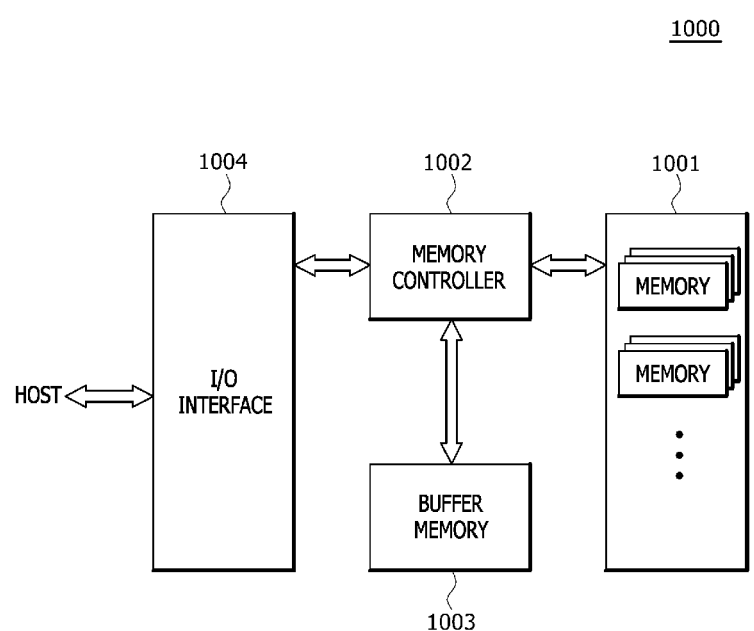
FIG. 21 is a block diagram illustrating a construction of an electronic system according to an example of the present disclosure.

The memory controller 1002 may decode an instruction that is applied by an external device (or a host device) through the I/O interface 1004 and may control the input and output of data to and from the data storage unit 1001 and the buffer memory 1003 based on a result of the decoding. In FIG. 21, the memory controller 1002 has been indicated as one block, but the memory controller 1002 may include a controller for controlling the data storage unit 1001 and a controller for controlling the buffer memory 1003, that is, volatile memory, which are independently constructed.

The buffer memory 1003 may temporarily store data to be processed by the memory controller 1002, that is, data (not illustrated) that is input to and output from the data storage unit 1001. The buffer memory 1003 may store data (not illustrated) that is applied by the memory controller 1002 in response to a control signal from the memory controller 1002. The buffer memory 1003 may include the semiconductor device 10 described with reference to FIG. 1. The buffer memory 1003 may read data that has been stored in the buffer memory 1003 and may output the read data to the memory controller 1002. The buffer memory 1003 may include volatile memory, such as dynamic random access memory (DRAM), mobile DRAM, and static random access memory (SRAM).

The I/O interface 1004 may provide a physical connection between the memory controller 1002 and an external device (or a host) so that the memory controller 1002 may receive a control signal for the input and output of data from the external device and exchange data with the external device. The I/O interface 1004 may include one of various interface protocols, such as a USB, an MMC, PCI-E, an SAS, SATA, PATA, an SCSI, an ESDI, and IDE.

The electronic system 1000 may be used as an auxiliary memory device or external storage device of a host device. The electronic system 1000 may include a solid state disk (SSD), universal serial bus (USB) memory, a secure digital (SD) card, a mini secure digital (mSD) card, a micro SD card, a secure digital high capacity (SDHC) card, a memory stick card, a smart media (SM) card, a multi-media card (MMC), an embedded MMC (eMMC), and a compact flash (CF) card.

Figure 22:
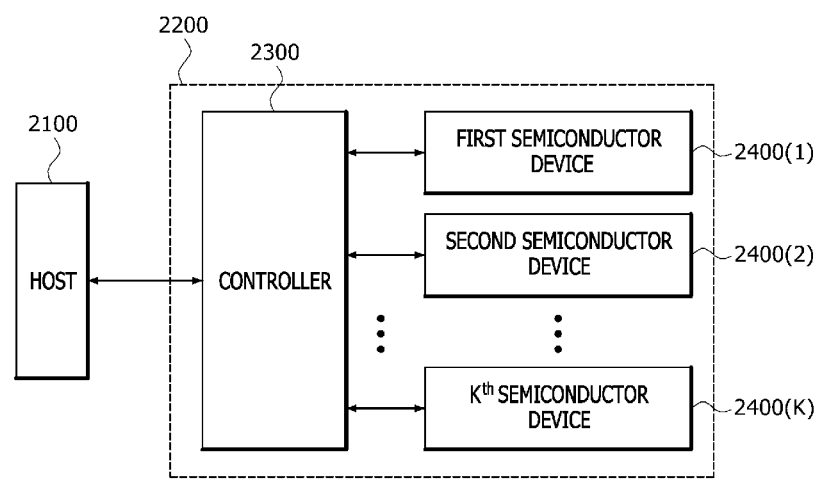
FIG. 22 is a block diagram illustrating a construction of an electronic system according to another example of the present disclosure.

FIG. 22 is a block diagram illustrating a construction according to an embodiment of an electronic system 2000 according to another embodiment of the present disclosure. As illustrated in FIG. 22, the electronic system 2000 may include a host 2100 and a semiconductor system 2200.

The host 2100 and the semiconductor system 2200 may mutually transmit signals by using an interface protocol. The interface protocol that is used between the host 2100 and the semiconductor system 2200 may include a multi-media card (MMC), an enhanced small disk interface (ESDI), integrated drive electronics (IDE), peripheral component interconnect—express (PCI-E), advanced technology attachment (ATA), serial ATA (SATA), parallel ATA (PATA), a serial attached SCSI (SAS), and a universal serial bus (USB).

The semiconductor system 2200 may include a controller 2300 and semiconductor devices 2400(1:K). The controller 2300 may apply a voltage code, a code input control signal, and a fuse selection address to each of the semiconductor devices 2400(1:K). Each of the semiconductor devices 2400 (1:K) may adjust a voltage level of an internal voltage by receiving the voltage code, the code input control signal, and the fuse selection address.

Each of the semiconductor devices 2400(1:K) may include the semiconductor device 10 described with reference to FIG. 1. Each of the semiconductor devices 2400(1: K) may be implemented as one of dynamic random access memory (DRAM), phase change random access memory (PRAM), resistive random access memory (RRAM), magnetic random access memory (MRAM), and ferroelectric random access memory (FRAM).

The embodiments of the present disclosure have been described so far. A person having ordinary knowledge in the art to which the present invention pertains will understand that the present invention may be implemented in a modified form without departing from an intrinsic characteristic of the present disclosure. Accordingly, the disclosed embodiments should be considered from a descriptive viewpoint, not from a limitative viewpoint. The range of the present disclosure is described in the claims not the aforementioned description, and all differences within an equivalent range thereof should be construed as being included in the present disclosure.

What is claimed is:

1. A semiconductor device comprising:
   a first crack detection circuit configured to receive a first external detection signal and output the first external detection signal as a first internal detection signal through a first metal line or configured to receive the first internal detection signal through the first metal line and output the first internal detection signal as the first external detection signal; and
   a second crack detection circuit configured to receive the first internal detection signal and output the first internal detection signal as a second internal detection signal through a second metal line or configured to receive the second internal detection signal through the second metal line and output the second internal detection signal as the first internal detection signal,
   wherein the second crack detection circuit is configured to set a logic level of one of the first internal detection signal and the second internal detection signal based on one of a first high setting signal and a first low setting signal.

2. The semiconductor device of claim 1, wherein the first external detection signal is received from an external device.

3. The semiconductor device of claim 1, wherein the first crack detection circuit is configured to receive a forward signal and a backward signal.

4. The semiconductor device of claim 3, wherein the first crack detection circuit is configured to:
   output the first external detection signal as the first internal detection signal through the first metal line based on the forward signal, and
   output the first internal detection signal that has been received through the first metal line as the first external detection signal based on the backward signal.

5. The semiconductor device of claim 3, wherein the first crack detection circuit comprises:
   a first logic element configured to buffer the first external detection signal; and
   a second logic element configured to generate the first internal detection signal by buffering an output signal of the first logic element based on the forward signal.

6. The semiconductor device of claim 5, wherein the first crack detection circuit comprises:
   a third logic element configured to buffer the first internal detection signal; and
   a fourth logic element configured to generate the first external detection signal by buffering an output signal of the third logic element based on the backward signal.

7. The semiconductor device of claim 1, wherein the second crack detection circuit is configured to receive a forward signal, a backward signal, the first high setting signal, and the first low setting signal.

8. The semiconductor device of claim 7, wherein the second crack detection circuit is configured to:
   output the first internal detection signal that has been received through the first metal line as the second internal detection signal through the second metal line based on the forward signal; and
   output the second internal detection signal that has been received through the second metal line as the first internal detection signal through the first metal line based on the backward signal.

9. The semiconductor device of claim 7, wherein the second crack detection circuit is configured to:
   set the logic level of the second internal detection signal as a first logic level based on the forward signal and the first high setting signal; and
   set the logic level of the second internal detection signal as a second logic level based on the forward signal and the first low setting signal.

10. The semiconductor device of claim 7, wherein the second crack detection circuit is configured to:
    set the logic level of the first internal detection signal as a first logic level based on the backward signal and the first high setting signal; and
    set the logic level of the first internal detection signal as a second logic level based on the backward signal and the first low setting signal.

11. The semiconductor device of claim 7, wherein the second crack detection circuit comprises:

a first logic element configured to perform a logic operation based on the first internal detection signal and the first low setting signal;
a second logic element configured to perform a logic operation based on an output signal of the first logic element and the first high setting signal;
a third logic element configured to invert and buffer an output signal of the second logic element; and
a fourth logic element configured to generate the second internal detection signal by inverting and buffering an output signal of the third logic element based on the forward signal.

12. The semiconductor device of claim 11, wherein the second crack detection circuit comprises:
a fifth logic element configured to perform the logic operation based on the second internal detection signal and the first low setting signal;
a sixth logic element configured to perform the logic operation based on an output signal of the fifth logic element and the first high setting signal;
a seventh logic element configured to invert and buffer an output signal of the sixth logic element; and
an eighth logic element configured to generate the first internal detection signal by inverting and buffering an output signal of the seventh logic element based on the backward signal.

13. The semiconductor device of claim 1, further comprising a third crack detection circuit configured to receive the second internal detection signal that has been received through the second metal line and output the second internal detection signal as a second external detection signal or configured to receive the second external detection signal and output the second external detection signal as the second internal detection signal through the second metal line.

14. The semiconductor device of claim 13, wherein the third crack detection circuit is configured to:
output the second internal detection signal that has been received through the second metal line as the second external detection signal based on the forward signal; and
output the second external detection signal as the second internal detection signal based on the backward signal.

15. The semiconductor device of claim 13, wherein the third crack detection circuit is configured to set a logic level of one of a third internal detection signal and the second external detection signal based on one of a second high setting signal and a second low setting signal.

16. The semiconductor device of claim 15, wherein the third crack detection circuit is configured to:
set the logic level of the second external detection signal as a first logic level based on a forward signal and the first high setting signal; and
set the logic level of the second external detection signal as a second logic level based on the forward signal and the first low setting signal.

17. The semiconductor device of claim 15, wherein the third crack detection circuit is configured to:
set the logic level of the second internal detection signal as a first logic level based on a backward signal and the first high setting signal; and
set the logic level of the second internal detection signal as a second logic level based on the backward signal and the first low setting signal.

18. A method of performing a crack detection operation, comprising:
setting, as a preset logic level, a logic level of a first internal detection signal that is transmitted through a first metal line when a forward signal has been activated, outputting the first internal detection signal as a second internal detection signal that is transmitted through a second metal line, and outputting the second internal detection signal as a first external detection signal; and
setting a logic level of the second internal detection signal as the preset logic level when the forward signal has been activated and outputting the second internal detection signal as the first external detection signal.

19. The method of claim 18, wherein:
the logic level of each of the first internal detection signal and the second internal detection signal is set as a first logic level based on a first high setting signal, and
the logic level of each of the first internal detection signal and the second internal detection signal is set as a second logic level based on a first low setting signal.

20. The method of claim 18, further comprising:
setting, as the preset logic level, a second internal detection signal that is transmitted through a second metal line when a backward signal has been activated, outputting the second internal detection signal as the first internal detection signal that is transmitted through the first metal line, and outputting the first internal detection signal as a second external detection signal; and
setting the first internal detection signal as the preset logic level when the backward signal has been activated and outputting the first internal detection signal as the second external detection signal.

* * * * *